(12) United States Patent
Perroni et al.

(10) Patent No.: US 7,457,908 B2
(45) Date of Patent: Nov. 25, 2008

(54) INTEGRATED MEMORY DEVICE WITH MULTI-SECTOR SELECTION COMMANDS

(76) Inventors: Maurizio Francesco Perroni, Via Roma, 18, I-98054 Furnari (ME) (IT); Salvatore Mazzara, Via Raffaello, 2A, I-90100 Palermo (PA) (IT); Paolino Schillaci, Via On. Bonfiglio, 104, I-92025 Casteltermini (AG) (IT)

( * ) Notice: Subject to any disclaimer, the term of this patent is extended or adjusted under 35 U.S.C. 154(b) by 298 days.

(21) Appl. No.: 10/984,372

(22) Filed: Nov. 8, 2004

(65) Prior Publication Data

US 2005/0157553 A1 Jul. 21, 2005

(30) Foreign Application Priority Data

Nov. 6, 2003 (IT) .......................... MI2003A2134

(51) Int. Cl.
*G06F 12/04* (2006.01)
(52) U.S. Cl. ...................................... 711/103
(58) Field of Classification Search .................. 711/103
See application file for complete search history.

(56) References Cited

U.S. PATENT DOCUMENTS 6,172,915 B1* 1/2001 Tang et al. ............. 365/185.29
2003/0093711 A1* 5/2003 Harari et al. ................... 714/8

OTHER PUBLICATIONS

"Intel Low Pin Count (LPC) Interface Specification" Aug. 2002, Revision 1.1, Document No. 251289-001.*

* cited by examiner

*Primary Examiner*—Hyung Sough
*Assistant Examiner*—Shawn Eland
(74) *Attorney, Agent, or Firm*—Blakely, Sokoloff, Taylor & Zafman LLP

(57) ABSTRACT

An integrated memory device is proposed. The memory device includes a flash memory having an address parallelism and a data parallelism; the flash memory is partitioned into a plurality of blocks each one including a plurality of sectors, which can be erased individually. A Low Pin Count communication interface is used to receive a command from an external bus, which has a transfer parallelism lower than the address parallelism and the data parallelism; the command includes a selection field for selecting each sector of one or more blocks individually. A control unit then executes an operation corresponding to the command in respect of each selected sector.

25 Claims, 9 Drawing Sheets

INTEGRATED MEMORY DEVICE WITH MULTI-SECTOR SELECTION COMMANDS

PRIORITY CLAIM

This application claims priority from Italian patent application No. MI2003A002134, filed Nov. 6, 2003, which is incorporated herein by reference.

TECHNICAL FIELD

The present invention relates to the microelectronics field. More specifically, the present invention relates to an integrated memory device based on a flash memory. The invention further relates to a data processing system including the integrated memory device. Moreover, the invention also relates to a corresponding method for operating the integrated memory device.

BACKGROUND

Integrated memory devices are commonly used in a multitude of applications for storing information. Particularly, the devices based on non-volatile memories allow preserving information even when a power supply is off; this category includes the flash $E^2PROMs$, which must be erased in sectors (instead of one cell at a time).

Different communication protocols (with respective bus architectures) have been proposed in the last years for interfacing the memory devices with external units. Particular attention has been devoted to protocols that operate with a low number of signals, so as to limit the corresponding number of pins of the memory devices. An example of those protocols is the Low Pin Count (LPC) protocol.

The memory devices that are compliant with the LPC protocol include a communication interface operatively coupled with the flash memory. This interface bridges between the flash memory and an external bus, which has a transfer parallelism typically lower than an address parallelism and a data parallelism of the flash memory. The bus exploits a time division-multiplexing scheme, which allows exchanging information between the flash memory and the external units in chucks corresponding to its transfer parallelism. In this way, it is possible to reduce the cost and the size of the memory devices (but with a loss in their access and transfer rate).

However, the communication interfaces known in the art are not completely satisfactory. Particularly, the available solutions are not very flexible; this makes it rather complex to use the memory devices in some specific applications.

Particularly, the known memory devices do not exploit the performance of the corresponding flash memories at their best in applications requiring the repetition of consecutive operations relating to the sectors.

A typical example is an erase operation of the flash memory. In this respect, the sectors are logically grouped into blocks. The LPC protocol supports two different erase commands that can be used to erase a single sector or all the sectors of a block, respectively. A drawback of this solution is that the execution of erase operations on multiple sectors in succession involves a significant overload of the bus; indeed, the erase operations require two communication cycles on the bus for each sector to be erased; therefore, the bus remains busy for a period that is relatively long (with a detrimental effect on the operation of the external units).

Similar drawbacks are experienced when protection registers of the flash memory must be configured; as it is well known, each protection register is associated with a corresponding sector to specify whether the sector is locked or not for writing. Even in this case, the LPC protocol supports a command for writing the protection registers of a single sector or of all the sectors of a block; therefore, an overload of the bus is experienced when the protection registers of multiple sectors must be written in succession.

The above-mentioned drawbacks have been exacerbated by the modern data compression techniques, which have fostered a very high granularity of the flash memories (in terms of reduced size of the sectors). Indeed, the rate of the operations relating to the sectors increases accordingly with a corresponding negative impact on the performance of a whole system wherein the memory device is embedded.

SUMMARY

According to an aspect of the present invention, the possibility of selecting the sectors dynamically is suggested.

Particularly, an aspect of the invention provides an integrated memory device. The integrated memory device includes a flash memory having an address parallelism and a data parallelism; the flash memory is partitioned into a plurality of blocks each one including a plurality of sectors (which can be erased individually). A communication interface is used to receive a command from an external bus, which has a transfer parallelism lower than the address parallelism and the data parallelism; the command includes a selection field for selecting each sector of one or more blocks individually. Control means then executes an operation corresponding to the command in respect of each selected sector.

The proposed integrated memory device is very flexible, so that it is well suited to a multitude of applications.

Particularly, the devised solution provides high performance in applications requiring the repetition of consecutive operations relating to the sectors of the flash memory. Indeed, in this case the bus remains busy for a relatively short period (without adversely affecting the operation of the external units).

The above-mentioned advantages are clearly perceived when the flash memory has a high granularity (i.e., a small size of the sectors).

The preferred embodiments of the invention described in the following provide additional advantages.

For example, without detracting from its general applicability, the proposed solution has been specifically designed for selecting the sectors of a single block (through a corresponding selection mask).

This choice is a good compromise between the opposed requirements of flexibility and simplicity.

In a specific embodiment of the invention, the operation is an erase operation of each selected sector.

Advantageously, the command includes a secondary command code that is used to discriminate between an erase operation of multiple sectors (selected dynamically), an erase operation of all the sectors of a block, or an erase operation of a single sector.

In this way, the integrated memory device can be used with either the new dynamic erase command or the standard (block or sector) erase commands known in the art.

A suggested choice for implementing the erase command is that of using two communication cycles, with the selection mask that is provided in a data field of the second communication cycle.

The proposed solution is compatible with the protocols currently in use.

In a preferred embodiment of the invention, an erase mask for the flash memory is set to the selection mask (provided with the dynamic erase command) or to a further selection mask generated inside the integrated memory device according to an address of the selected block or sector (provided with the block erase command or the sector erase command, respectively).

This implementation requires minimal changes to the structure of the integrated memory device.

In a different embodiment of the invention, the operation is a write operation of each protection register.

Advantageously, the integrated memory device can be switched between two different operative modes (wherein it implements a write operation of multiple protection registers selected dynamically, or a write operation of the protection registers of a single block or sector, respectively).

In this way, the integrated memory device can support either the new dynamic write command or the standard (block or erase) write command known in the art.

A suggested choice for implementing the dynamic write command is that of using two communication cycles (with the selection mask that is provided in a data field of the second communication cycle).

The proposed solution allows exploiting the same protocol of the standard write command known in the art for the first communication cycle.

In a preferred embodiment of the invention, a write mask (for the protection registers) is set to the selection mask (provided with the dynamic write command) or to a further selection mask generated inside the integrated memory device according to an address of the protection registers of the selected block or sector (provided with the standard write command).

This implementation requires minimal changes to the structure of the integrated memory device.

Without detracting from its general applicability, the proposed solution has been specifically designed for the LPC protocol.

Typically, an integrated memory device according to an embodiment of the present invention is used in a data processing system (for example, a computer).

Another aspect of the present invention provides a corresponding method of operating an integrated memory device.

The characterizing features of the present invention are set forth in the appended claims. The invention itself, however, as well as further features and advantages thereof will be best understood by reference to the following detailed description, given purely by way of a non-restrictive indication, to be read in conjunction with the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
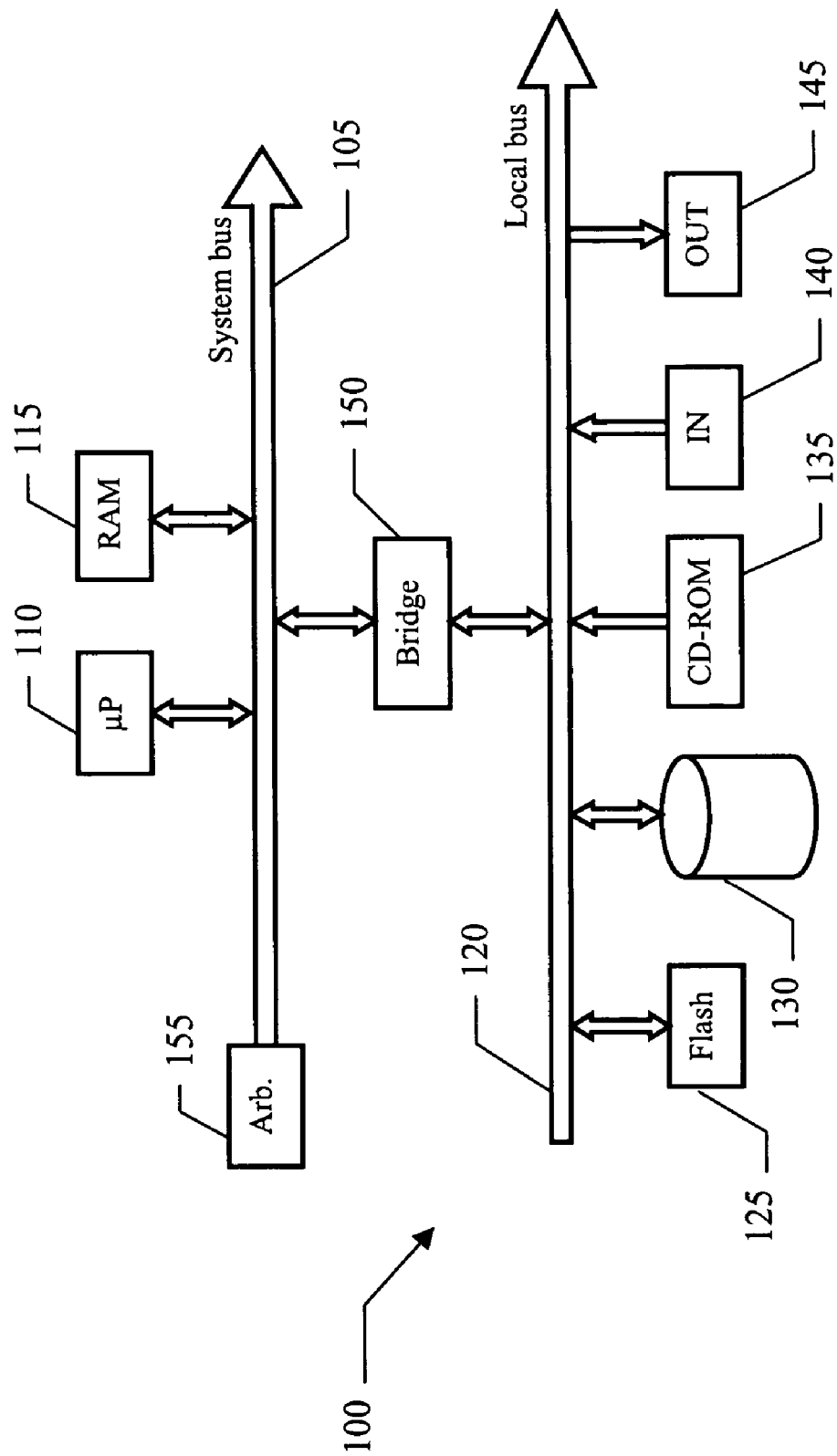
FIG. 1 is an illustrative representation of a computer in which the integrated memory device according to an embodiment of the invention can be used.

With reference in particular to FIG. 1, a computer 100 (for example, a PC) is formed by several units that are connected in parallel to a system bus 105. In detail, a microprocessor (μP) 110 controls operation of the computer 100, and a RAM 115 is directly used as a working memory by the microprocessor 110. Several peripheral units are clustered around a local bus 120 (for example, of the Peripheral Component Interconnect, or PCI, type). Particularly, a non-volatile memory device 125 (based on a flash memory) stores basic code for the microprocessor 110; a mass memory consists of a hard-disk 130 and a CD-ROM drive 135. Moreover, the computer 100 includes input units 140 (for example, a keyboard and a mouse), and output units 145 (for example, a monitor and a printer). A bridge unit 150 interfaces the system bus 105 with the local bus 120. The microprocessor 110 and the bridge unit 150 can operate as master agents requesting an access to the system bus 105 for transmitting information. An arbiter 155 manages the granting of the access with mutual exclusion to the system bus 105.

Typically, the basic code stored on the memory device 125 consists of the BIOS (Basic Input/Output System) of the computer 100. The BIOS is the program that is used for the bootstrap of the computer 100 (allowing the computer 100 to start when turned on); moreover, the BIOS controls the flow of data with the other peripheral units of the computer 100. Typically, the BIOS is updated by the microprocessor 110 following any configuration change of the computer 100.

Figure 2:
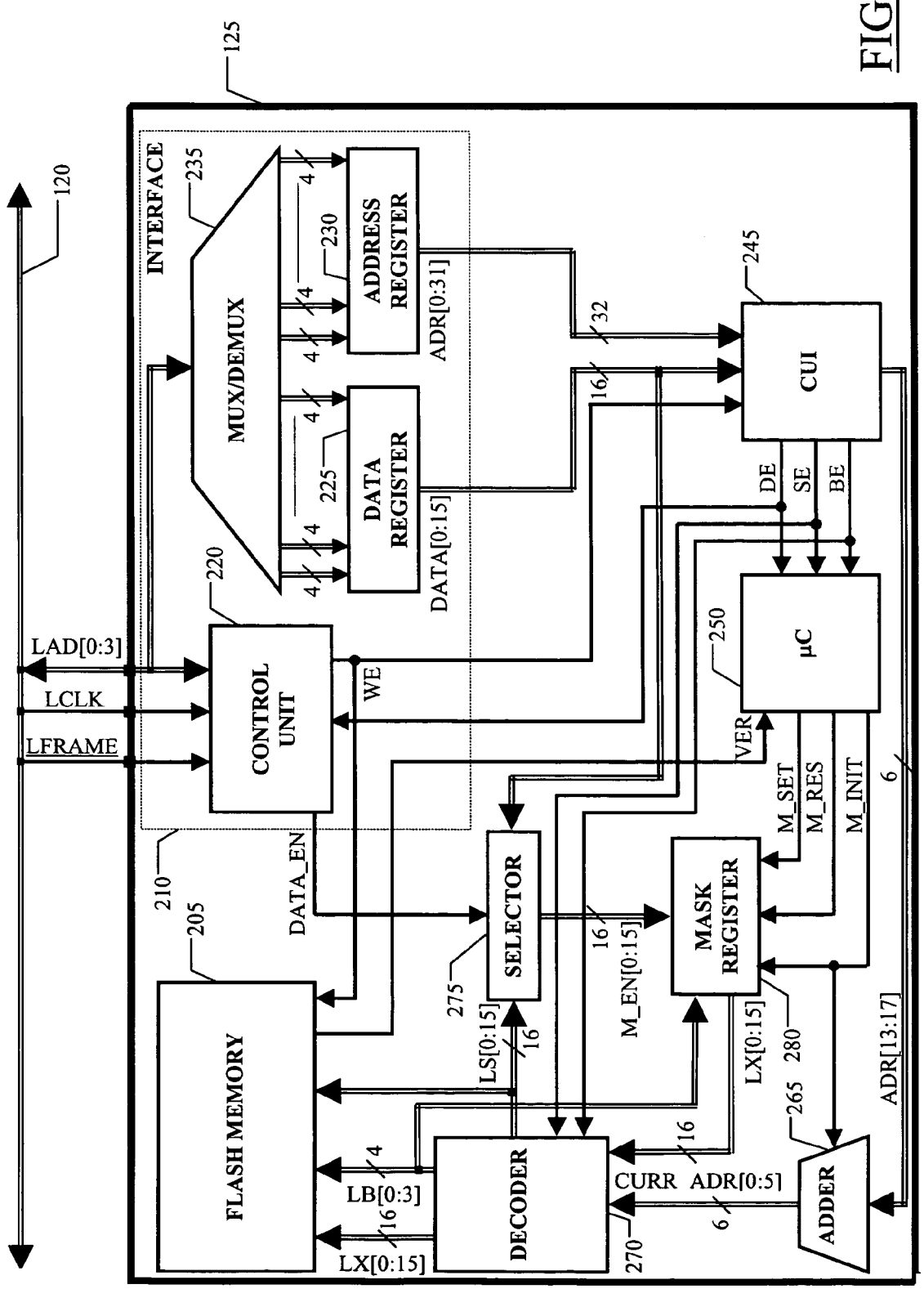
FIG. 2 is a schematic block-diagram of a portion of the integrated memory device relevant to an erase operation according to one embodiment of the present invention.

Considering now FIG. 2, the memory device 125 includes a flash memory 205 and an LPC communication interface 210 (which are integrated in the same chip of semiconductor material); the communication interface 210 is used for connecting the memory device 125 to the bus 120, so as to allow the other units of the computer (not shown in the figure) to access the flash memory 205.

The flash memory 205 has a data parallelism defined by the number of bits of each addressable location (for example, 8 bits). The flash memory 205 has instead an address parallelism depending on its size; for example, a flash memory 205 of 2 Mbits requires an address of at least 18 bits for selecting a desired location (of 8 bits). The flash memory 205 is partitioned into multiple sectors (being erasable individually), which sectors are logically grouped into blocks. Typically, each block consists of 64 Kbytes (with the flash memory 205 at issue that includes 4 blocks). In turn, the block can consist of a single sector or of multiple sectors; for example, the block of 64 Kbytes can be partitioned as follows:

1×16 Kbytes+2×8 Kbytes+1×32 Kbytes

8×8 Kbytes

16×4 Kbytes

The configuration of the blocks of the flash memory 205 is defined by setting a corresponding non-volatile register.

The bus 120 has a transfer parallelism lower than the address parallelism and the data parallelism of the flash memory 205. Particularly, according to the LPC protocol 4 lines are used in a time-division-multiplexed mode for transferring data serially in chunks of 4 bits (a nibble) at a time (transfer signals LAD[0], LAD[1], LAD[2], and LAD[3]). Furthermore, a dedicated line is used for transmitting a clock signal LCLK (for synchronizing the units connected to the bus 120), and another line is used for providing a start signal LFRAME (for a communication cycle between two units connected to the bus 120); the start signal LFRAME is underlined to indicate that it is asserted at a low logic value 0 (for example, equal to a reference voltage or ground) and de-asserted at a high logic value 1 (for example, equal to a power supply voltage of the memory device 125). In addition, the communication interface 210 is connected to further lines of the bus 120 provided by the LPC protocol (not shown in the figure), such as power supply and reference lines. Each line of the bus 120 is connected to a respective pin of a package of the memory device 125.

The communication interface 210 includes a control unit 220, which is connected to the transfer lines LAD[0:3], to the clock line LCLK and to the start line LFRAME (in the following, the signals and the corresponding lines will be denoted with the same names and references). The control unit 220 manages operation of the memory device 125, through corresponding control signals that enable and synchronize its different blocks.

The communication interface 210 also includes a data register 225 and an address register 230. A multiplexing/de-multiplexing circuit (mux/demux) 235 selectively connects the two registers 225 and 230 with the transfer lines LAD[0:3]. The data register 225 includes a number of latches sufficient to store a data sequence of 16 bits (DATA[0:15]). The LCP protocol involves the transmission of addresses of 32 bits, which are stored into corresponding latches of the address register (ADR[0:31]). The 16 latches of the data register 225 and the 32 latches of the address register 230 are enabled to receive a nibble at a time from the bus 120.

The control unit 220 supplies a write-enable signal WE to the flash memory 205 and to a command unit (also known as Common User Interface, or CUI) 245; the write-enable signal WE is asserted in response to a write command code received from the bus 120 (involving an erase operation or a program operation on the flash memory 205). The command unit 245 receives the data sequence DATA[0:15] (from the data register 225) and the address ADR[0:31] (from the address register 230) in a clock period.

In response to a secondary command code received from the data register 225, the command unit 245 asserts a corresponding command signal for a microcontroller (μC) 250. Particularly, a command signal SE is asserted in response to a secondary command code for erasing a sector, a command signal BE is asserted in response to a secondary command code for erasing a block, and a command signal DE is asserted in response to a secondary command code for erasing multiple sectors (selected dynamically, as described in the following). The algorithm that is implemented by the microcontroller 250 for erasing the flash memory 205 also includes a routine for verifying the result of the operation; this result is schematically indicated in the figure with a corresponding signal VER, which is returned by the flash memory 205 to the microcontroller 250.

The 18 least significant bits (LSB) of the address ADR[0:31] identify a location of the flash memory 205; the 6 most significant bits (MSB) of this location address (ADR[12:17]) identify the corresponding sector. When the command unit 245 receives the sector erase command code, the sector address ADR[12:17] identifies the desired sector to be erased. Likewise, when the command unit 245 receives the block erase command code, the 2 most significant bits of the sector address ADR[12:17] (ADR[16:17]) identify the desired block to be erased (i.e., all its sectors). On the contrary, when the command unit 245 receives the dynamic erase command code, the bits ADR[16:17] again identify the desired block; the sectors to be erased in this block are instead discriminated by a selection mask provided by the data register 225 (which consists of a further data sequence DATA[0:15] having the bits corresponding to the desired sectors at the logic value 1 and the other bits at the logic value 0).

The command unit 245 supplies the sector address ADR[12:17] to an adder 265, which generates a current address CURR_ADR[0:5] (initially set to the sector address ADR[12:17]). The adder 265 in succession increases the current address CURR_ADR[0:5] by one and transmits it to a decoder 270; the decoder 270 accordingly generates a block sequence of 4 bits LB[0:3], which indicates the block including the sectors to be erased. The decoder 270 also receives the sector erase command signal SE and the block erase command signal BE from the command unit 245; in response thereto, the decoder 270 generates a sector sequence of 16 bits LS[0:15], which identifies the sectors inside the block to be erased. Particularly, when the block erase command signal BE is asserted all the bits of the sector sequence LS[0:15] have the logic value 1; conversely, when the sector erase command signal SE is asserted the sector sequence LS[0:15] has a single bit (corresponding to the current address CURR_ADR[0:5]) equal to the logic value 1.

The dynamic erase command signal DE is instead returned by the command unit 245 to the control unit 220. Accordingly, the control unit 220 asserts a selection signal DATA_EN, which is provided to a selector 275. The selector 275 receives the sector sequence LS[0:15] at a first input (from the decoder 270) and the selection mask DATA[0:15] at a second input (from the data register 225). The selector 275 transmits an enable sequence M_EN[0:15], which is equal to the selection mask DATA[0:15] when the selection signal DATA_EN is asserted (in response to the dynamic erase command signal DE) or it is equal to the sector sequence LS[0:15] otherwise.

A mask register 280 (including a cell for each sector of the flash memory 205) is implemented with a volatile memory having low access time and power consumption (such as a Static RAM, or SRAM). The mask register 280 receives the block sequence LB[0:3] (from the decoder 270) and the enable sequence M_EN[0:15] (from the selector 275); this information is used to enable updating the desired cells of an erase mask.

The adder 265 and the mask register 280 are initialized by a corresponding signal M_INIT, which is supplied by the microcontroller 250. The mask register 280 also receives a set signal M_SET and a reset signal M_RES from the microcontroller 250. The mask register 280 provides an erase mask LX[0:15] for the sectors in the selected block; the erase mask LX[0:15] is received by the decoder 270. The decoder 270 supplies the block sequence LB[0:3], the sector sequence LS[0:15], and the erase mask LX[0:15] to the flash memory 205.

Figure 3A:
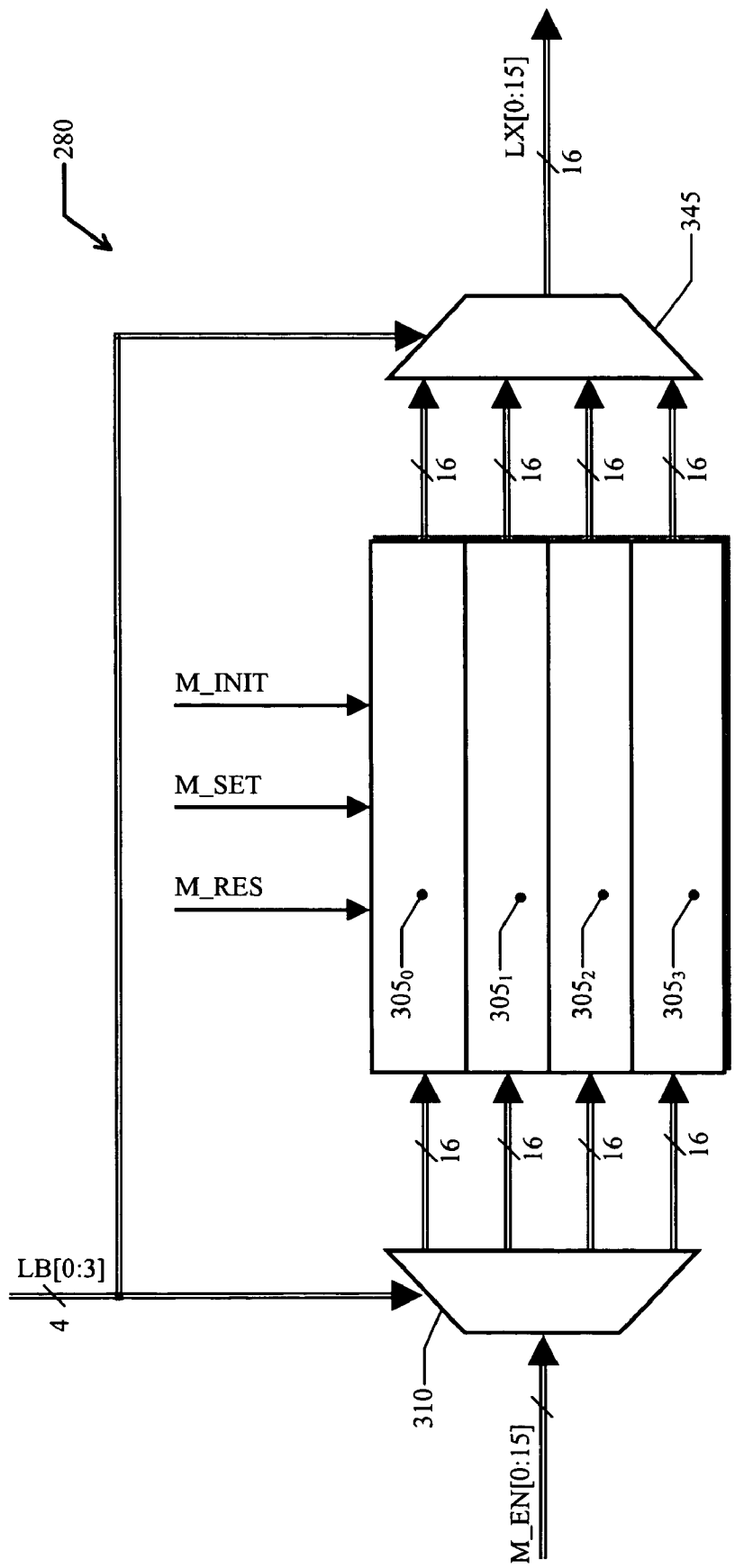
FIG. 3a shows one embodiment of a suggested implementation of a mask register of the integrated memory device.

A suggested implementation of the mask register 280 is illustrated in FIG. 3a. The cells of the mask register 280 are partitioned into groups, each one corresponding to a block of the flash memory 205; in the example at issue, the mask register 280 consists of 4 groups $305_0$, $305_1$, $305_2$ and $305_3$, each one of 16 mask cells. All the cells of the mask register 280 receive the initializing signal M_INIT, the set signal M_SET, and the reset signal M_RES.

The mask register 280 further includes a demultiplexer 310, which is controlled by the block sequence LB[0:3]; the demultiplexer 310 receives the enable sequence M_EN[0:15] and transmits each bit thereof to a corresponding cell of the group $305_0$-$320_3$ identified by the block sequence LB[0:3].

The outputs of all the cells of the mask register 280 are connected to a multiplexer 345, which supplies the erase mask LX[0:15]. The block sequence LB[0:3] is also used to control the multiplexer 345 so as to select the corresponding group of mask cells $305_0$-$305_3$ (each one providing a corresponding bit of the erase mask LX[0:15]).

Figure 3B:
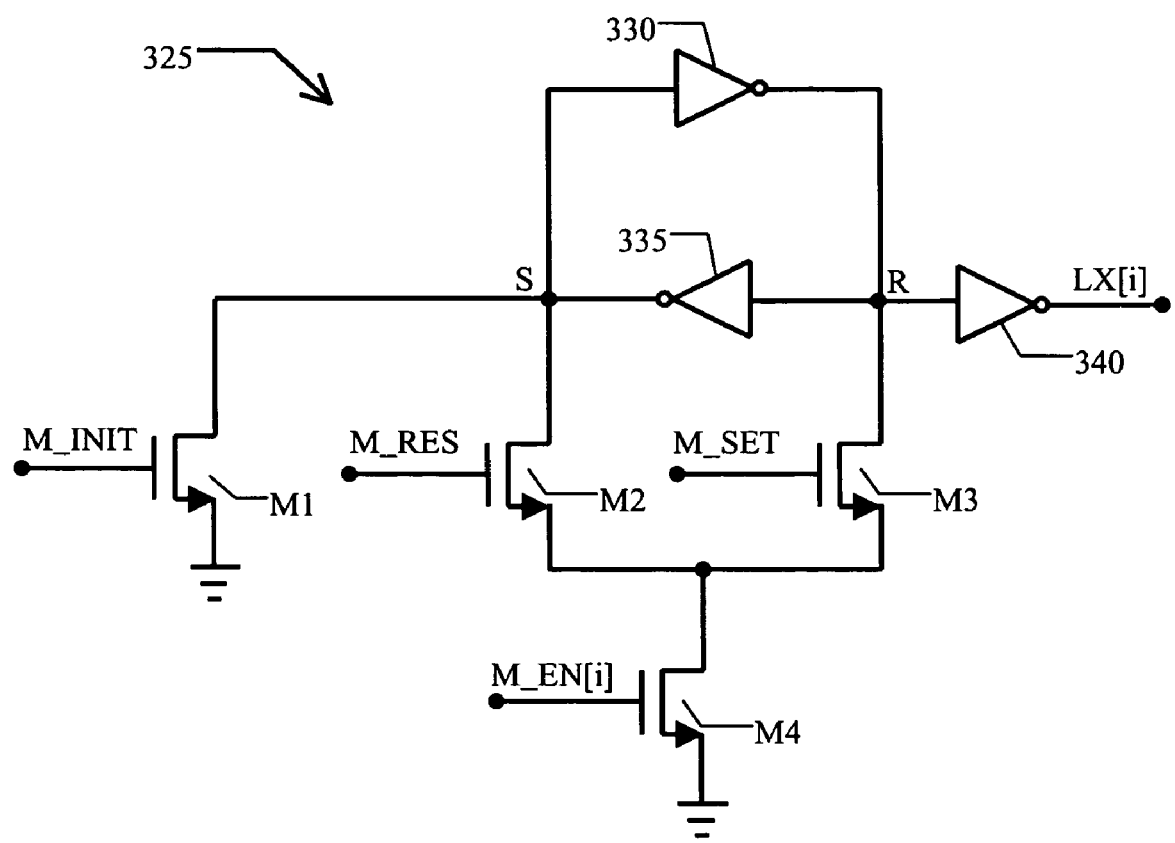
FIG. 3b depicts a circuit scheme of a cell of the mask register according to one embodiment of the present invention.

FIG. 3b depicts the circuit scheme of a generic cell of the mask register 280 (denoted with 325). The mask cell 325 includes a latch consisting of two inverters 330 and 335. In detail, the input terminal of the inverter 330 is connected to the output terminal of the inverter 335 to form a set node S, while the output terminal of the inverter 330 is connected to the input terminal of the inverter 335 to form a reset node R.

The cell 325 also includes an n-MOS transistor M1 having the drain terminal connected to the set node S and the source terminal connected to a reference line (providing the ground voltage); the gate terminal of the transistor M1 receives the initialization signal M_INIT. Furthermore, two n-MOS transistors M2 and M3, with the respective source terminals connected to each other, have the drain terminals connected to the set node S and to the reset node R, respectively. The gate terminal of the transistor M2 receives the reset signal M_RES, while the gate terminal of the transistor M3 receives the set signal M_SET.

An n-MOS transistor M4 has the drain terminal connected to the source terminals of the transistors M2 and M3, and the source terminal connected to the reference line. The gate terminal of the transistor M4 receives the respective bit of the enable sequence M_EN[i].

A further inverter 340 has the input terminal connected to the reset node R; the output terminal of the inverter 340 defines the output of the mask cell 325, which provides the corresponding bit of the erase mask LX[i].

When the initialization signal M_INIT is asserted, the transistor M1 turns on; as a result, the set node S is brought to the logic value 0, while the reset node R is brought the logic value 1 (irrespective of the signals M_SET, M_RES and M_EN[i]). In this way, the latch 330,335 stores the logical value 1; therefore, the erase mask bit LX[i] takes the logical value 0.

The enable bit M_EN[i] is used to allow updating the content of the mask cell 325 according to the signals M_SET and M_RES. Indeed, when the enable bit M_EN[i] is deasserted the transistor M4 is off and then the nodes S and R are always floating (irrespective of the signals M_SET and M_RES). Conversely, when the enable bit M_EN[i] is asserted, the transistor M4 turns on and the mask cell 325 is set or reset in response to the set signal M_SET or to the reset signal M_RES, respectively. Particularly, if the set signal M_SET is asserted, the transistor M3 turns on as well and the reset node R is brought to the logic value 0, while the set node S is brought to the logic value 1; therefore, the latch 330,335 stores the logical value 0 and the erase mask bit LX[i] takes the logical value 1. Conversely, if the reset signal M_RES is asserted, the transistor M2 turns on and the set node S is brought to the logic value 0, while the reset node R is brought to the logic value 1; therefore, the latch 330,335 stores the logical value 1 and the erase mask bit LX[i] takes the logical value 0.

The different erase operations supported by the memory device will now be described with reference to FIGS. 4-5 (each one considered together with FIG. 2). Generally, any interaction of the flash memory 205 with the external units (for example, the microprocessor) involves one or more communication cycles specified by the LPC protocol (each one partitioned into predefined steps, or fields); the communication cycles take a number of clock periods depending on the operation to be performed and on the amount of information to be exchanged (addresses or data). Particularly, each erase operation requires two consecutive communication cycles, so as to ensure a greater degree of safety with respect to possible spurious erasures.

Figure 4:
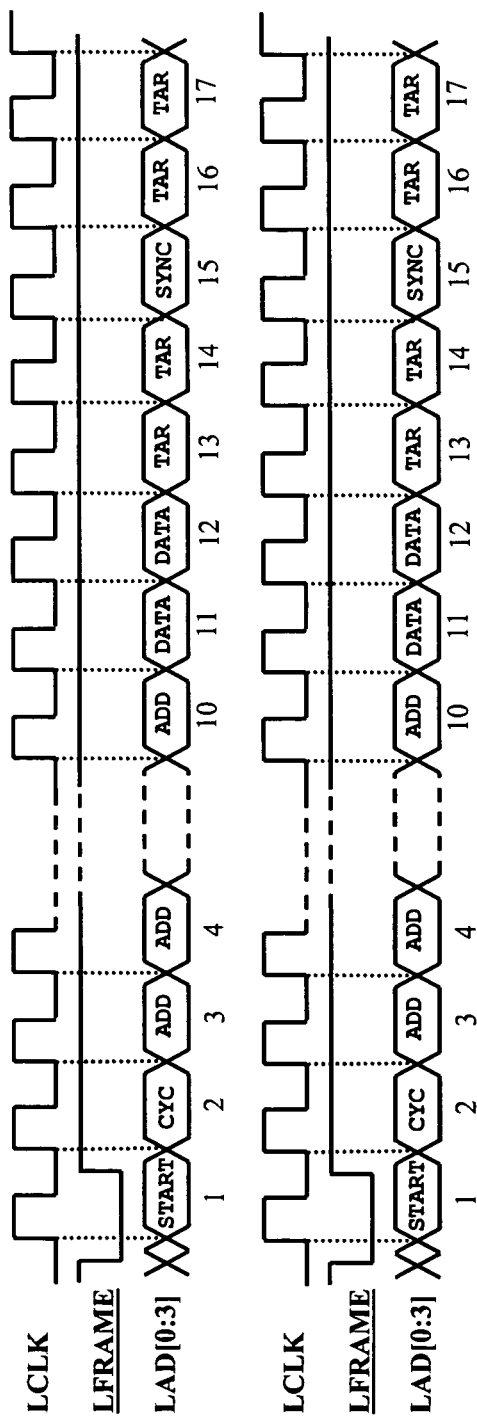
FIG. 4 is a simplified timing diagram relating to an erase operation (of a single sector or of all the sectors of a block) known in the art.

The timing of a standard erase operation (i.e., a block erase operation or a sector erase operation) is depicted in FIG. 4. In order to start any operation on the memory device 125, the external unit asserts the corresponding signal LFRAME. This event is detected by the control unit 220, which then waits at a clock period 1 for receiving a start command code of 4 bits (for example, equal to 0001) from the transfer lines LAD[0:3] (field START). In response thereto, at the clock period 2 the control unit 220 waits for receiving a command code of 4 bits from the same transfer lines LAD[0:3] (field CYC).

Assuming that the control unit 220 recognizes a write command code (for example, 0110), it asserts the write-enable signal WE (provided to the flash memory 205 and to the command unit 245). Starting from the clock period 3, the control unit 220 enables the mux/demux 235 to connect the transfer lines LAD[0:3] to the address register 230. The address register 230 is driven to receive and store an address ADR[0:31] of 32 bits a nibble at a time (field ADD); this means that at the clock period 3 the first 4 latches of the address register 230 receive a first nibble, at the clock period 4 the second 4 latches of the address register 230 receive the next nibble, and so on until all the 32 bits of the address ADR[0:31] are received. The operation then requires 8 clock periods (from the clock period 3 to the clock period 10); the LPC protocol does not envisage any use of this information.

The control unit 220 then enables the mux/demux 235 to connect the transfer lines LAD[0:3] to the data register 225. The data register 225 is likewise driven to receive and store a data sequence DATA[0:7] of 8 bits a nibble at a time (field DATA); the operation requires 2 clock periods (from the clock period 11 to the clock period 12). The data sequence DATA[0:7] loaded in the corresponding register 225 defines a secondary command code, which is transmitted to the command unit 245 (in a single clock period). As a consequence, the command unit 245 asserts the command signal SE (in response to the sector erase command code, such as 01000010) or the command signal BE (in response to the block erase command code, such as 00100000); in both cases, the microcontroller 250 then asserts the initialization signal M_INIT for resetting the content of the adder 265 and of the erase mask 280.

At the clock period 13 the external unit provides an inversion code of 4 bits (for example, equal to 1111) through the transfer lines LAD[0:3] (field TAR), so as to cause an inversion of the communication direction. In response thereto, at the clock period 14 the control unit 220 sets the pins of the memory device 125 connected to the transfer lines LAD[0:3] to high impedance (field TAR); this allows the communication interface 210 to take the control of the bus 120 without any interference problem.

A synchronization phase (field SYNC), in which the control unit 220 transmits a synchronization code (for example, equal to 0101) to the external unit through the transfer lines LAD[0:3], takes place at the clock period 15; the synchronization code indicates that the request has been correctly received by the memory device 125.

Starting from the clock period 16, two further clock periods (the clock periods 16 and 17) are required to terminate the first communication cycle with a further inversion of the communication direction (field TAR). Particularly, at the clock period 16 the control unit 220 transmits the inversion code to the external unit through the lines LAD[0:3] and at the clock period 17 it sets the pins of the memory device 125 to high impedance. The external unit, after receiving the inversion code, takes back the control of the bus 120.

In the second communication cycle of the erase operation, the LPC protocol again involves the transmission of the start code at the clock period 1 (field START), of the write command code at the clock period 2 (field CYC) and of the address ADR[0:31] from the clock period 3 to the clock period 10 (field ADD).

In this case, the address ADR[0:31] identifies the sector of the block to be erased. The address register 230 is then enabled to transmit the whole address ADR[0:31] in a single clock period to the command unit 245, which in turn transmits the sector address ADR[12:17] to the adder 265. The adder 265 generates the current address CURR_ADR[0:5] (initially equal to ADR[12:17]), which is then provided to the decoder 270.

At the clock periods 11 and 12 the secondary command code is received again (field DATA). The LPC protocol then requires two clock periods (the clock periods 13 and 14) to invert the direction of communication (field TAR) and a clock period (the clock period 15) for the synchronization (field SYNC). The second communication cycle ends with a further inversion at the clock periods 16 and 17 (field TAR), to allow the external unit to take back the control of the bus 120.

In the meantime, the decoder 270 generates the block sequence LB[0:3], by setting the bit corresponding to the block selected by the current address CURR_ADR[0:5] to the logic value 1. Besides, the decoder 270 also generates the sector sequence LS[0:15]; particularly, if the sector erase command signal SE is asserted only the bit corresponding to the sector selected by the current address CURR_ADR[0:5] is set to the logic value 1, while if the block erase command signal BE is asserted all the bits are set to the logic value 1. The selector 275 now applies the enable sequence M_EN[0:15], equal to the sector sequence LS[0:15] (selection signal DATA_EN deasserted) to the mask register 280. The microcontroller 250 then asserts the set signal M_SET. In this way, the content of the cells of the erase mask 280 selected by the block sequence LB[0:3] and the enable sequence M_EN[0:15] are set to the logic value 1.

The flash memory 205 receives the erase mask LX[0:15] (through the decoder 270); therefore, the erase mask LX[0:15] initially will have only one bit equal to the logic value 1 (corresponding to the desired sector to be erased) or all the bits equal to the logic value 1 (when the whole block must be erased); in response thereto, the flash memory 205 enables the selected sectors to receive a first erase pulse. At the end of this procedure, the flash memory 205 verifies whether the desired memory cells have been actually erased.

Considering in particular the sector erase operation, if the sector identified by the sequences LB[0:3],LS[0:15] has not been completely erased the same procedure is reiterated (applying a further erase pulse with higher intensity). Conversely, the verification signal VER is asserted; in response thereto, the microcontroller 250 asserts the reset signal M_RES. Therefore, the content of the cell of the erase mask 280 corresponding to the selected sector is set to the logic value 0, thereby ending the sector erase operation.

On the other hand, in the block erase operation the adder 265 first of all sets the 4 least significant bits of the current address CURR_ADR[0:5] to the logic value 0, thereby producing the address of the first sector of the selected block. The decoder 270 updates the sector sequence LS[0:15] accordingly (by setting all the bits except the least significant one to the logic value 0). If the first sector of the block identified by the sequences LB[0:3],LS[0:15] has been completely erased the verification signal VER is asserted; in response thereto, the microcontroller 250 asserts the reset signal M_RES. Therefore, the content of the cell of the erase mask 280 corresponding to the first sector of the block is set to the logic value 0. Subsequently, the adder 265 increases the current address CURR_ADR[0:5] by one, thereby pointing to the second sector of the block. Conversely, if the first sector of the block has not been completely erased, the current address CURR_ADR[0:5] is directly increased by one. The same steps are repeated in succession for all the sectors of the selected block. At the end of the verification procedure, only the bits of the erase mask LX[0:15] corresponding to the sectors still to be erased will be at the logic value 1. The same procedure is then reiterated by applying a further erase pulse; in this case, however, the erase pulse is only passed to the sectors corresponding to the bits of the erase mask LX[i] at the logic value 1. The microcontroller 250 ends the block erase operation when all the bits of the erase mask LX[i] are at the logic value 0.

The erase operation known in the art then requires 2 communication cycles (for a total of 34 clock periods) to erase each sector of the flash memory 205; therefore, in the worst case wherein all the sectors of a block but one must be erased in succession, 15 communication cycles (and then 510 clock periods) are required.

Figure 5:
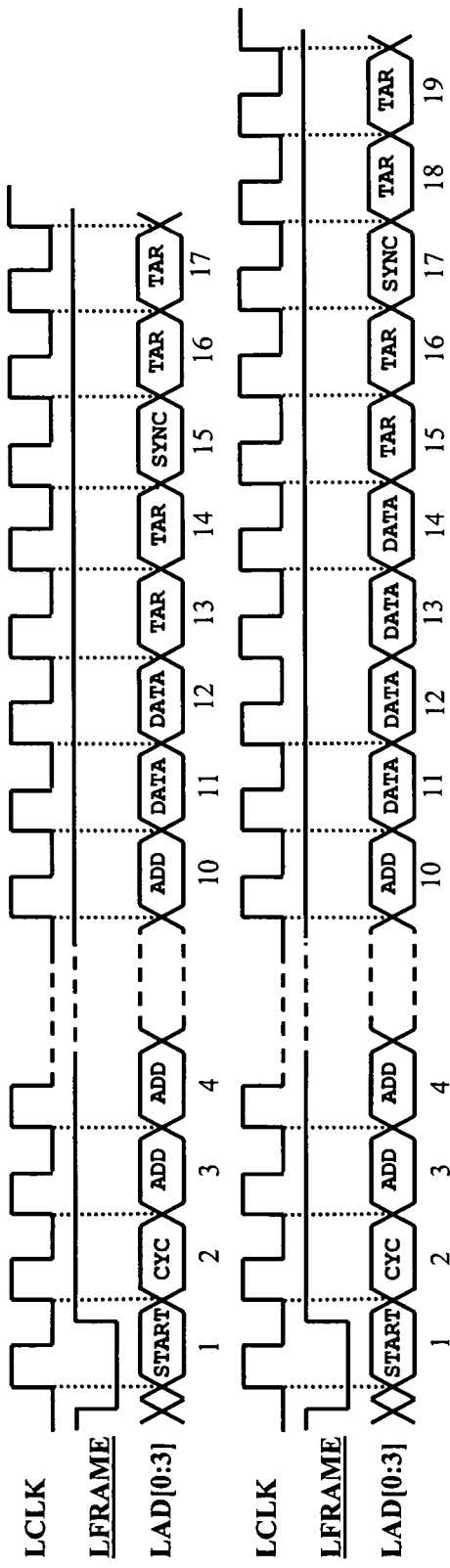
FIG. 5 is a simplified timing diagram relating to an erase operation of multiple sectors selected dynamically, according to an embodiment of the present invention.

In addition to the above-described sector erase operation and block erase operation, the memory device 125 also supports the dynamic erase operation depicted in FIG. 5. The first communication cycle is similar to the one provided by the LPC protocol for the standard erase operation; in this case, however, the command unit 245 receives the dynamic erase command code (for example, 00110110) at the clock periods 11 and 12. In response thereto, the command unit 245 asserts the corresponding command signal DE. The microcontroller 250 accordingly asserts the initialization signal M_INIT for resetting both the adder 265 and the SRAM 275, and at the same time the control unit 220 asserts the selection signal DATA_EN.

Similar considerations apply to the second communication cycle. In this case, however, from the clock period 11 to the clock period 14 the external unit transmits the selection mask DATA[0:15]. The sector address ADR[12:17] is provided to the command unit 245, which in turn provides it to the adder 265 (so as to generate the current address CURR_ADR[0:5] as described above). However, in this case the selector 280 applies the enable sequence M_EN[0:15], equal to the selection mask DATA[0:15] (selection signal DATA_EN asserted), to the mask register 280. The enable sequence M_EN[0:15] concurrently enables the cells of the erase mask 280 corresponding to the desired sectors, whose content is set to the logic value 1 thanks to the set signal M_SET asserted by the microcontroller 250.

The corresponding erase mask LX[0:15] provided by the decoder 270 to the flash memory 205 enables the selected sectors to receive the first erase pulse. The erase operation (with the verification procedure) then continues as described in the case of the block erase operation.

The dynamic erase operation is very fast, since it allows avoiding repeated communication cycles for the transfer of the corresponding addresses. Besides, the internal erase algorithm is performed only once, instead of a number of times equal to the sectors to be erased. For example, the above-mentioned erasure of 15 sectors only requires 36 clock periods (instead of the 510 clock periods of the memory devices known in the art).

Figure 6:
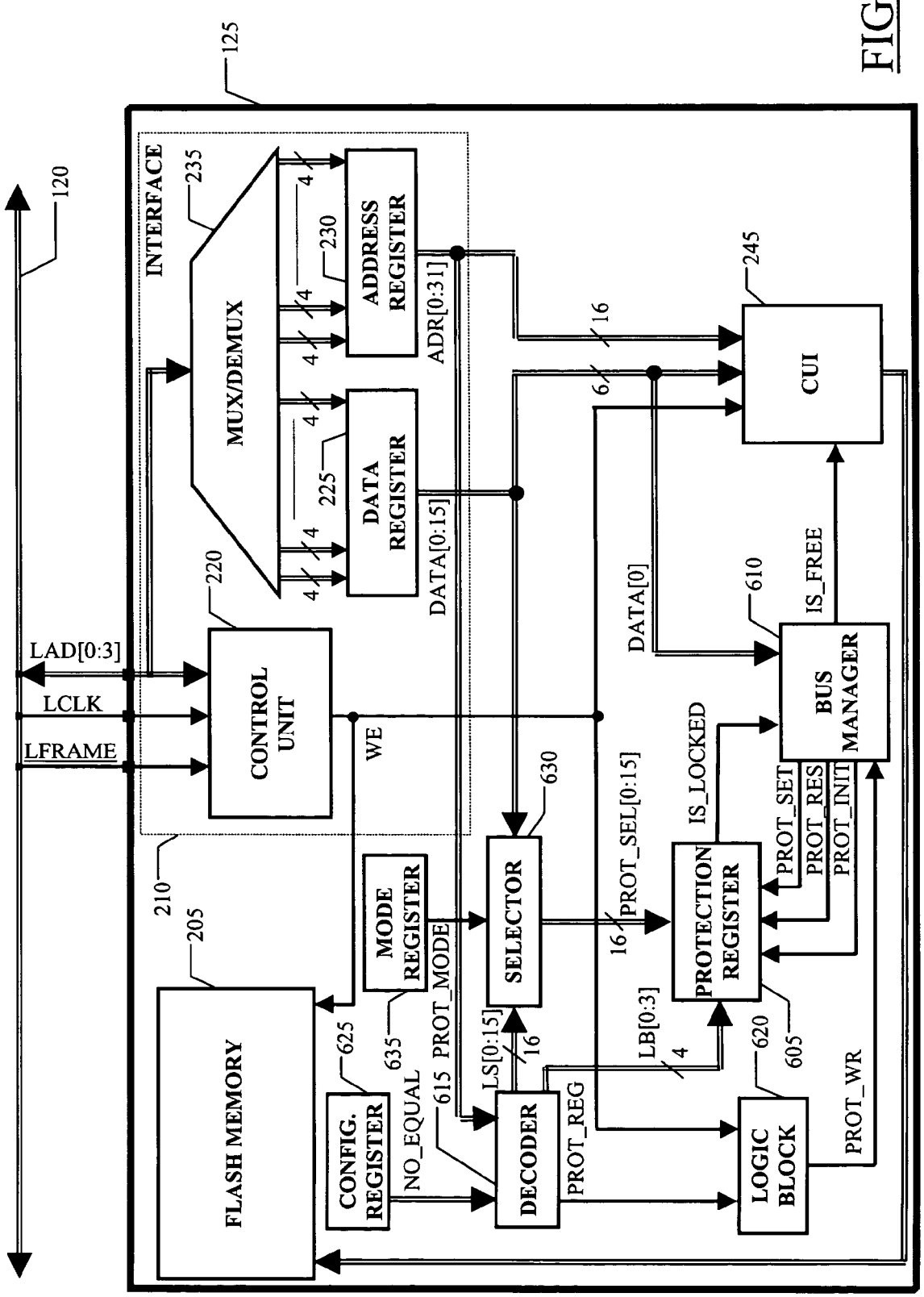
FIG. 6 is a schematic block-diagram of a portion of the integrated memory device relevant to a writing operation of protection registers according to one embodiment of the present invention.

Moving now to FIG. 6, a schematic block-diagram of a different portion of the same integrated memory device 125 is illustrated (in the following, the elements corresponding to the ones shown in the preceding figures are denoted with the same references, and their explanation will be omitted for the sake of brevity).

In this case, the memory device includes a bank of protection registers 605 (for example, implemented with a SRAM). Each protection register 605 is associated with a corresponding sector of the flash memory 205; the protection register 605 indicates whether the corresponding sector is locked for writing. A read operation may be performed on every sector, while a write operation (i.e., an erase or a program operation) is only allowed on the unlocked sectors. This mechanism makes it possible to protect the flash memory 205 from undesired erasing and/or programming, thereby preventing any accidental loss of data.

For this purpose, whenever a write operation must be performed on a current sector, a bus manager 610 accesses the corresponding protection register 605 and receives a locked signal IS_LOCKED (which is asserted when the current sector is locked for writing). The bus manager 610 then provides an unlocked signal IS_FREE=/IS_LOCKED (which is asserted when the current sector is unlocked) to the command unit 245. The command unit 245 accordingly enables or prevents the execution of the write operation on the current sector of the flash memory 205.

The bus manager 610 also controls the writing of the protection registers 605. Particularly, the bus manager 610 applies an initialization signal PROT_INIT (which is used to assert all the protection registers 605 at the power-on of the memory device 125). The bus manager 610 receives the desired value to be written into each selected protection register 605 with the least significant bit stored in the data register 225 (DATA[0]). The bus manager 610 accordingly asserts a set signal PROT_SET or a reset signal PROT_RES for the protection registers 605 (when the protection bit DATA[0] is equal to the logic value 1 or to the logic value 0, respectively).

The address ADR[0:31] stored in the register 230 is supplied to a decoder 615. The decoder 615 generates a recognition signal PROT_REG, which is asserted when the address ADR[0:31] relates to an address space of the protection registers 605 (instead of the flash memory 205); for example, the address space of the protection registers 605 and the address space of the flash memory 205 are discriminated by the bit ADR[22] being deasserted or asserted, respectively.

The recognition signal PROT_REG is provided by the decoder 615 to a logic block 620, which also receives the write-enable signal WE from the control unit 220. When the recognition signal PROT_REG and the write-enable signal WE are both asserted (to indicate a write operation on the protection registers), the logic block 620 asserts a corresponding enable signal PROT_WR that is returned to the bus manager 610.

The decoder 615 identifies the block corresponding to the protection registers to the written by means of the bits ADR [16:17]; the decoder 615 can also identify the sector corresponding to the protection register to be written by means of the bits ADR[12:17]. Accordingly, the decoder 615 generates a block sequence of 4 bits LB[0:3] that indicates the block including the selected protection register(s). The decoder 615 also receives a configuration signal NO_EQUAL from a corresponding configuration or data register 625; the configuration signal NO_EQUAL is asserted when the blocks consist of multiple sectors or it is deasserted when the blocks consist of single sectors. The decoder 615 also generates a sector sequence of 16 bits LS[0:15] that indicates the selected sector(s). Particularly, when the configuration signal NO_EQUAL is deasserted all the bits of the sector sequence LS[0:15] have the logic value 1; conversely, when the configuration signal NO_EQUAL is asserted the sector sequence LS[0:15] has a single bit (corresponding to the bits ADR[12: 17] ) equal to the logic value 1.

A selector 630 is controlled by a mode signal PROT_MODE, which is stored in a corresponding mode register 635; the mode signal PROT_MODE is deasserted when the memory device 125 is configured to operate in a standard mode (wherein a write operation can act on the protection registers 605 of all the sectors of a block or on the protection register of a single sector), or it is asserted when the memory device 125 is configured to operate in a dynamic mode (wherein the write operation can act on multiple protection registers 605 of a block selected dynamically). When the mode signal PROT_MODE is asserted, the sectors which protection registers must be written are discriminated by a selection mask provided by the data register 225 (which consists of a further data sequence DATA[0:15] having the bits corresponding to the desired protection registers at the logic value 1 and the other bits at the logic value 0).

The selector 630 receives the sector sequence LS[0:15] at a first input (from the decoder 615) and the selection mask DATA[0:15] at a second input (from the data register 225). The selector 630 transmits a write mask PROT_SEL[0:15], which is equal to the selection mask DATA[0:15] when the mode signal PROT_MODE is asserted or it is equal to the sector sequence LS[0:15] otherwise.

The protection registers 605 receive the block sequence LB[0:3] (from the decoder 615) and the write mask PROT_SEL[0:15] from the selector 630; this information is used to enable writing the desired protection registers 605.

Figure 7A:
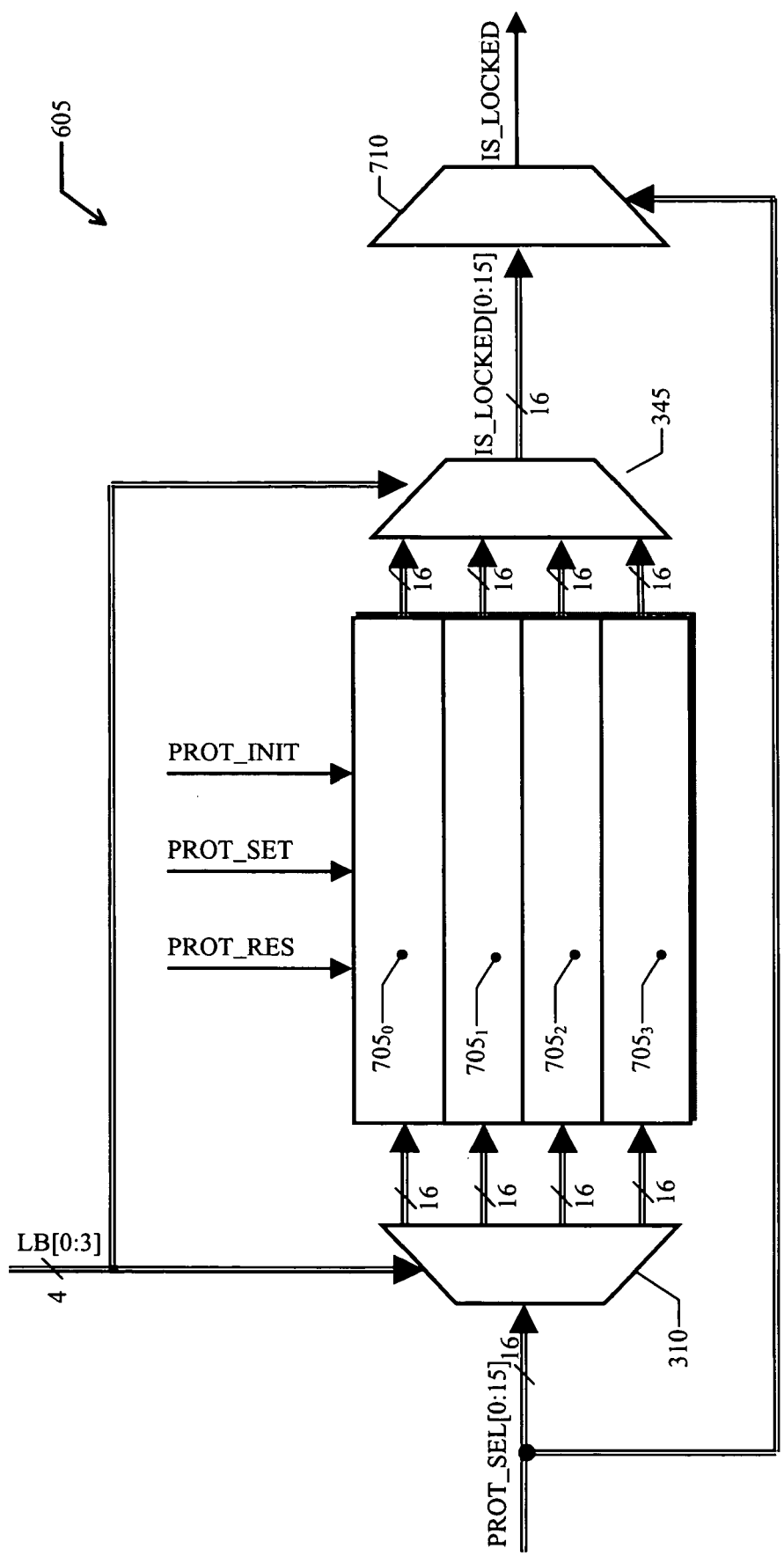
FIG. 7a shows one embodiment of a suggested implementation of the protection registers.

A suggested implementation of the bank of protection registers 605 is illustrated in FIG. 7a. The structure of the bank of protection registers 605 is substantially the same as the one of the mask register described in FIG. 3a. Particularly, the protection registers are partitioned into 4 groups $705_0$, $705_1$, $705_2$ and $705_3$ (corresponding to the blocks of the flash memory). All the protection registers receive the initializing signal PROT_INIT, the set signal PROT_SET, and the reset signal PROT_RES;

In this case, the demultiplexer 310 (controlled by the block sequence LB[0:3]) receives the write mask PROT_SEL[0:15] and transmits each bit thereof to a corresponding protection register of the group $705_0$-$705_3$ identified by the block sequence LB[0:3].

The outputs of all the protection registers 605 are connected to the multiplexer 345 (controlled by the block sequence LB[0:3]), which supplies a sequence of 16 locked signals IS_LOCKED[0:15] (for the sectors in the relevant block). The locked signal sequence IS_LOCKED[0:15] is applied to a further multiplexer 710, which provides the desired locked signal IS_LOCKED; for this purpose, the multiplexer 710 is controlled by the write mask PROT_SEL [0:15].

Figure 7B:
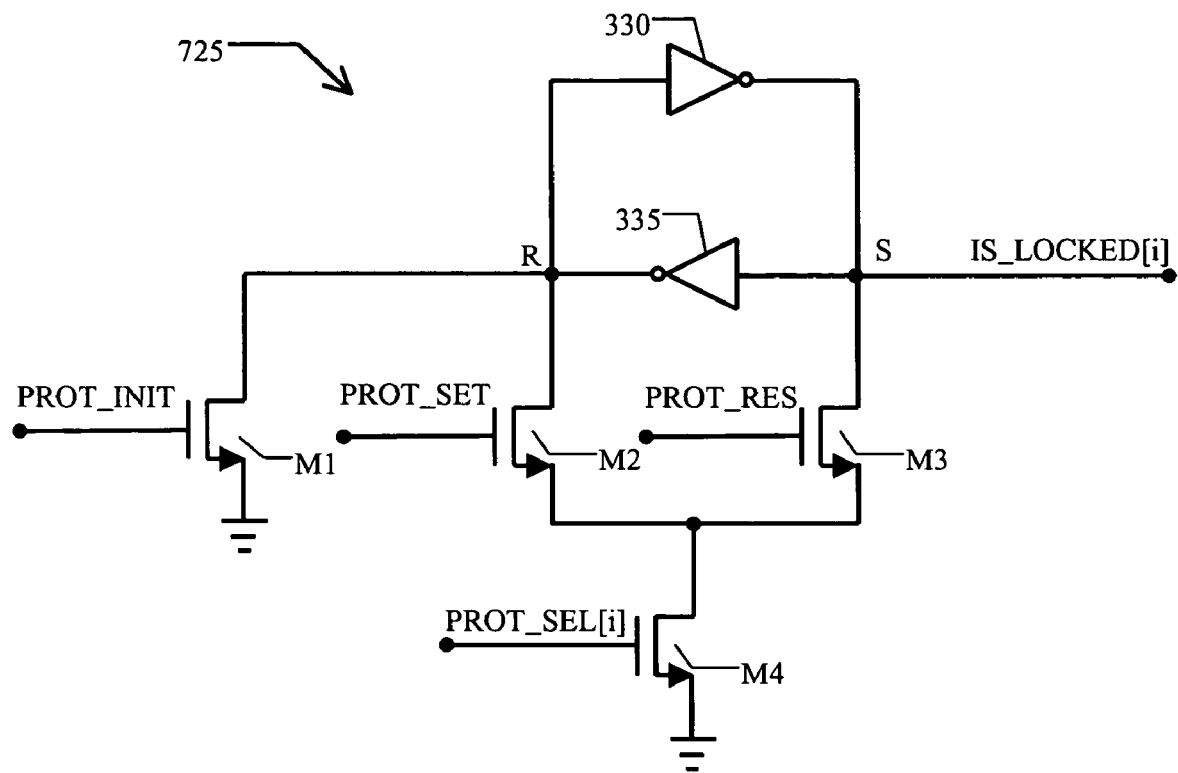
FIG. 7b depicts a circuit scheme of a generic protection register according to one embodiment of the present invention.

FIG. 7b depicts the circuit scheme of a generic protection register (denoted with 725). The structure of the protection register 725 is substantially the same as the one of the mask cell described in FIG. 3b. Particularly, the initialization signal PROT_INIT is applied to the transistor M1 and the respective bit of the write mask PROT_SEL[i] is applied to the transistor M4. However, in this case the set signal PROT_SEL controls the transistor M2 while the reset signal PROT_RES controls the transistor M3 (so that the position of the set node S and of the reset node R are exchanged). Moreover, the set node S provides the corresponding bit of the locked sequence IS_LOCKED[i] directly (without any inverter).

In this way, when the initialization signal PROT_INIT (applied to the transistor M1) is asserted the locked bit IS_LOCKED[i] will take the logical value 1 (irrespective of the signals PROT_SET, PROT_RES and PROT_SEL[i]).

Figure 8:
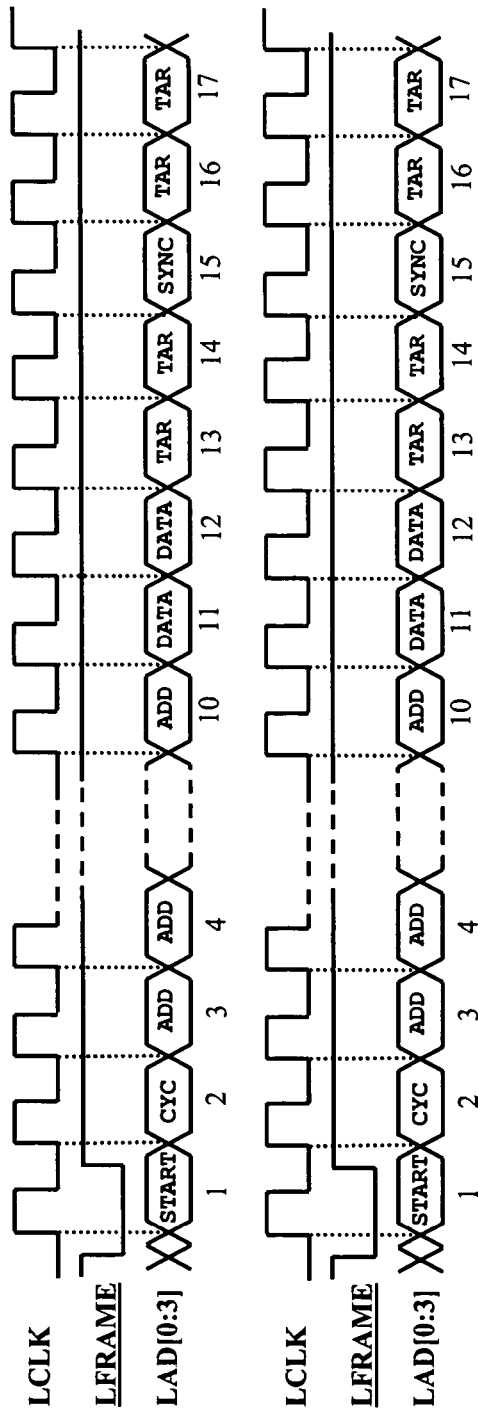
FIG. 8 is a simplified timing diagram relating to a write operation (of the protection registers of a single sector or of all the sectors of a block) known in the art.
Figure 9:
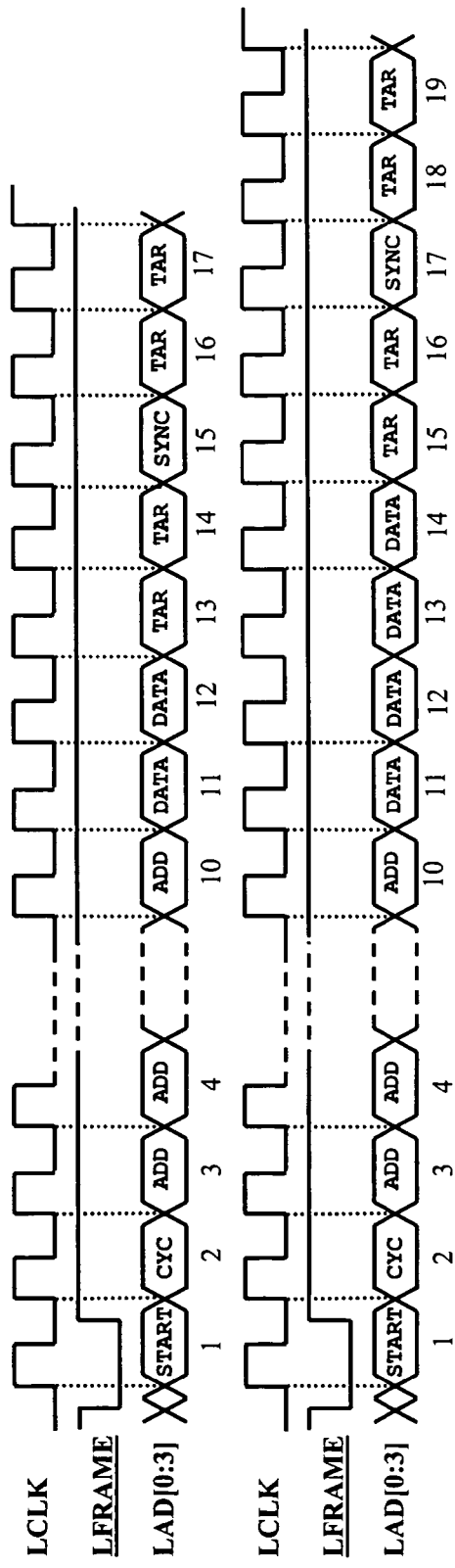
FIG. 9 is a simplified timing diagram relating to a write operation of the protection registers of multiple sectors selected dynamically, according to a further embodiment of the present invention.

The different write operations of the protection registers supported by the memory device will now be described with reference to FIGS. 8-9 (each one considered together with FIG. 6). Particularly, the timing of a standard write operation of the protection registers is depicted in FIG. 8. The write operation requires a single communication cycle (which is started by the external unit asserting the corresponding signal LFRAME). The LPC protocol then involves the transmission of the start command code at the clock period 1 (field START) and of the write command code at the clock period 2 (field CYC); as a result, the control unit asserts the write-enable signal WE (provided to the flash memory 205, to the command unit 245, and to the logic block 620).

An address ADR[0:31] is provided from the clock period 3 to the clock period 10 (field ADD). Assuming that the address ADR[0:31] loaded in the corresponding register 230 relates to the address space of the protection registers 605, the decoder 615 asserts the recognition signal PROT_REG for the logic block 620. At the same time, the decoder 615 generates the block sequence LB[0:3] for the protection registers 605, by setting the bit corresponding to the block selected by the address ADR[0:31] to the logic value 1. Besides, the decoder 615 also generates the sector sequence LS[0:15]; particularly, all the bits are set to the logic value 1 if the configuration signal NO_EQUAL is deasserted, while only the bit corresponding to the sector selected by the address ADR[0:31] is set to the logic value 1 otherwise. The selector 630 then applies the write mask PROT_SEL[0:15], equal to the sector sequence LS[0:15] (mode signal PROT_MODE deasserted), to the protection registers 605.

A data sequence of 8 bits is now transmitted from the clock period 11 to the clock period 12 (field DATA). The least significant bit DATA[0] stored in the data register 225 defines the desired protection bit to be written into each selected protection register 605, which protection bit DATA[0] is provided to the bus manager 610. In the meantime, in response to the recognition signal PROT_REG the logic block 620 asserts the enable signal PROT_WR (which is supplied to the bus manager 610). The bus manager 610 accordingly asserts the set signal PROT_SET or the reset signal PROT_RES for the protection registers 605 (when the protection bit DATA[0] is equal to the logic value 1 or to the logic value 0, respectively). In this way, the protection bit DATA[0] is written into the selected protection registers 605 (of all the sectors of a block or of a single sector).

The LPC protocol then continues with two clock periods (the clock periods 13 and 14) for inverting the direction of communication (field TAR) and a clock period (the clock period 15) for the synchronization (field SYNC). The communication cycle ends with a further inversion at the clock periods 16 and 17 (field TAR), to allow the external unit to take back the control of the bus 120.

The write operation known in the art then requires 17 clock periods to configure the protection register of each sector of the flash memory 205; therefore, in the worst case wherein all the sectors of a block but one must be written in succession (with the configuration signal NO_EQUAL asserted), 15 communication cycles (and then 255 clock periods) are required.

Conversely, when the mode signal PROT_MODE is asserted the memory device 125 supports the writing of the protection registers of multiple sectors in a block. In this case, as shown in FIG. 9, the write operation on the protection registers requires two consecutive communication cycles, which are similar to the ones of the dynamic erase operation illustrated in FIG. 5.

The first communication cycle is the same as the one of the standard write operation described above. Particularly, the first communication cycle involves the transmission of the start code at the clock period 1 (field START), of the write command code at the clock period 2 (field CYC) and of the address ADR[0:31] from the clock period 3 to the clock period 10 (field ADD); in this case, no use of the address ADR[0:31] is envisaged.

A data sequence of 8 bits is now transmitted from the clock period 11 to the clock period 12 (field DATA). Even in this case, the least significant bit DATA[0] stored in the data register 225 defines the desired protection bit to be written into each selected protection register 605.

The LPC protocol continues with two clock periods (the clock periods 15 and 16) for inverting the direction of communication (field TAR) and a clock period (the clock period 17) for the synchronization (field SYNC). The first communication cycle ends with a further inversion at the clock periods 18 and 19 (field TAR), to allow the external unit to take back the control of the bus 120.

The second communication cycle likewise involves the transmission of the start code at the clock period 1 (field START), and of the write command code at the clock period 2 (field CYC). Likewise, the address ADR[0:31] is provided from the clock period 3 to the clock period 10 (field ADD); in response thereto, the decoder 615 generates the block sequence LB[0:3] accordingly.

A data sequence of 16 bits is now transmitted from the clock period 11 to the clock period 14 (field DATA). The data sequence DATA[0:15] stored in the corresponding register 225 identifies the selection mask for the protection registers to be written.

The write operation is then executed as described above for the standard write command. However, in this case the selector 630 applies the write mask PROT_SEL[0:15], equal to the selection mask DATA[0:15] (mode signal PROT_MODE asserted), to the protection registers 605.

Likewise, the second communication cycle ends with the clock periods 13 and 14 for inverting the direction of communication (field TAR), the clock period 15 for the synchronization (field SYNC), and the clock periods 16 and 17 for inverting again the direction of communication (field TAR).

The proposed write operation is very fast, since it allows avoiding repeated communication cycles for the transfer of the corresponding addresses. For example, the above-mentioned writing of 15 sectors only requires 36 clock periods (instead of the 255 clock periods of the memory devices known in the art).

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the flash memory has a different address parallelism and data parallelism, of if the external bus has a different transfer parallelism; likewise, the flash memory can be partitioned in another way (with either the blocks or the sectors that have a different size).

Alternatively, different command codes can be used, or the communication cycles and the respective fields can be defined in another way.

Moreover, there is nothing to prevent setting the erase mask with an equivalent procedure; for example, the selector can be controlled by the command unit directly (even if the control of the selector by the interface is preferred, since it requires less changes to the command unit of the memory device).

Similar considerations apply if the integrated memory device is switched between its different operative modes and/or configurations using external pins.

In any case, the erase mask and/or the protection registers can have a different structure, or each erase mask cell and protection register can be implemented with another circuit solution. Likewise, equivalent algorithms can be used to erase the sectors (even without any verification procedure), or to manage the protection of the sectors.

Even though in the preceding description reference has been made to the LPC protocol, this is not to be intended in a limitative manner (with the proposed solution that can be applied to different communication protocols as well).

Alternatively, the computer wherein the memory device is used can have another structure or can be replaced with any data processing entity (such as a PDA, a mobile phone, a microcontroller, a DSP, and the like).

In any case, the reference to the use of the memory device with a PCI bus, for storing the BIOS to be used by the microprocessor of the computer, is merely illustrative (with the proposed memory device that can find application for any other purpose).

Moreover, it will be apparent to those skilled in the art that the additional features providing further advantages are not essential for carrying out the invention, and may be omitted or replaced with different features.

For example, the selection of sectors belonging to two or more blocks is contemplated; moreover, it is also possible to identify the desired sectors in another way (for example, by means of their offsets in the corresponding block).

Alternatively, the memory device can support the dynamic erase command only; in addition, the possibility of configuring the memory device (for example, through a corresponding register) to recognize the dynamic erase command or the standard erase command is contemplated.

Without departing from the principles of the invention, the erase operation can also be implemented with a single communication cycle (for example, increasing the length of the field DATA for transmitting the selection mask together with the secondary command code).

In any case, the use of different solutions for masking the erase pulses is not excluded (even with a dedicated circuit for implementing the dynamic erase command).

Likewise, the memory device can support the write command of multiple protection registers only; in addition, the possibility of providing a secondary command code for selecting the desired write operation is contemplated.

Without departing from the principles of the invention, the write operation can also be implemented with a single communication cycle (for example, adding a further clock period to the field DATA for transmitting the desired protection bit after the selection mask).

Moreover, the use of different solutions for writing the protection registers is not excluded.

It should be noted that memory devices according to embodiments of the present invention can also support the dynamic command for the erase operation only, for the write operation of the protection registers only, or for both of them at the same time. In any case, the principles of the invention are not limited to those operations; for example, the same concepts can also be applied to a reading operation of the protection registers or to other similar operations.

From the foregoing it will be appreciated that, although specific embodiments of the invention have been described herein for purposes of illustration, various modifications may be made without deviating from the spirit and scope of the invention.

What is claimed is:

1. An integrated memory device including:
  a flash memory having an address parallelism and a data parallelism, the flash memory being partitioned into a plurality of blocks each one including a plurality of sectors being erasable individually,
  a communication interface for receiving a command from an external bus having a transfer parallelism lower than the address parallelism and the data parallelism, the command including a selection field for selecting a random subset of multiple sectors of at least one block,
  control means for executing an erase operation corresponding to the command in respect of each selected sector;
  wherein the command includes a main code identifying the erase operation and a secondary code having a first value, a second value or a third value, when the secondary code has the first value the selection field selecting each sector of a block individually and the control means erasing each selected sector, when the secondary code has the second value the selection field selecting a single block and the control means erasing all the sectors of the selected block, and when the secondary code has the third value the selection field selecting a single sector and the control means erasing the selected sector; and
  wherein an erase command requires first and a second communication cycles with the external bus each one involving the transmission of a command field, an address field and a data field, in the first communication cycle the command field including the main code and the data field including the secondary code, and in the second communication cycle when the secondary code has the first value the address field including the address of the selected block and the data field including the selection mask, when the secondary field has the second value the address field including the address of the selected block, and when the secondary field has the third value the address field including the address of the selected sector.

2. The integrated memory device according to claim 1, further including means for storing an erase mask, means for applying an erase pulse to each sector of the selected block according to the erase mask, means for generating a further selection mask of all the sectors of the selected block in response to the secondary code having the second value or a still further selection mask of the selected sector in response to the secondary code having the third value, and means for setting the erase mask according to the selection mask in response to the secondary code having the first value, to the further selection mask in response to the secondary code having the second value, and to the still further selection mask in response to the secondary code having the third value.

3. The integrated memory device according to claim 1, wherein a protection register is associated with each sector, the operation being a write operation of the protection register of each selected sector.

4. An integrated memory device including:
a flash memory having an address parallelism and a data parallelism, the flash memory being partitioned into a plurality of blocks each one including a plurality of sectors being erasable individually;
a communication interface for receiving a command from an external bus having a transfer parallelism lower than the address parallelism and the data parallelism, the command including a selection field for selecting each sector of at least one block individually, wherein the at least one selected block consists of a single block, the selection field including an address of the selected block and a selection mask for the sectors of the selected block;
control means for executing an operation corresponding to the command in respect of each selected sector;
a protection register associated with each sector, the operation being a write operation of the protection register of each selected sector; and
means for switching the integrated memory device between a first operative mode and a second operative mode, and means for switching the integrated memory device between a first configuration and a second configuration, in the first operative mode the selection field selecting each sector of a block individually and the control means writing the protection register of each selected sector, in the second operative mode with the first configuration the selection field selecting a single block and the control means writing the protection registers of all the sectors of the selected block, and in the second operative mode with the second configuration the selection field selecting a single sector and the control means writing the protection register of the selected sector.

5. The integrated memory device according to claim 4, wherein the write command requires at least one communication cycle with the external bus involving the transmission of a command field, an address field and a data field, wherein in the first operative mode the write command requires a first and a second communication cycles, in the first communication cycle the command field including a write code identifying the write operation and the data field including a value to be written on the protection register of each selected sector, and in the second communication cycle the address field including the address of the selected block and the data field including the selection mask, and wherein in the second operative mode the write command requires a single communication cycle, the command field including the write code, the address field including the address of the selected block and further including the address of the selected sector with the second configuration, and the data field including the value to be written on the protection register of each selected sector.

6. The integrated memory device according to claim 5, further including means for enabling the update of each protection register according to a write mask, means responsive to the write code for generating a further selection mask of all the sectors of the selected block in the second operative mode with the first configuration or a still further selection mask of the selected sector in the second operative mode with the second configuration, and means for setting the write mask according to the selection mask in the first operative mode, to the further selection mask in the second operative mode with the first configuration, and to the still further selection mask in the second operative mode with the second configuration.

7. A data processing system including an integrated memory device, at least one external unit, and an external bus for connecting the integrated memory device with the at least one external unit, wherein the integrated memory device includes:
a flash memory having an address parallelism and a data parallelism, the flash memory being partitioned into a plurality of blocks each one including a plurality of sectors being erasable individually,
a communication interface for receiving a command from the external bus, the external bus having a transfer parallelism lower than the address parallelism and the data parallelism, wherein the command includes a selection field for selecting random multiple sectors of at least one block,
control means for executing an operation corresponding to the command in respect of each selected sector;
a protection register associated with each sector, the operation being a write operation of the protection register of each selected sector; and
a switching circuit operable to switch the integrated memory device between a first operative mode and a second operative mode, and means for switching the integrated memory device between a first configuration and a second configuration, in the first operative mode the selection field selecting each sector of a block individually and the control means writing the protection register of each selected sector, in the second operative mode with the first configuration the selection field selecting a single block and the control means writing the protection registers of all the sectors of the selected block, and in the second operative mode with the second configuration the selection field selecting a single sector and the control means writing the protection register of the selected sector.

8. A computer including an integrated memory device, a microprocessor, and a local bus for connecting the integrated memory device with the microprocessor, wherein the integrated memory device includes:
a flash memory having an address parallelism and a data parallelism, the flash memory being partitioned into a plurality of blocks each one including a plurality of sectors being erasable individually, a Low Pin Count communication interface for receiving a command from the local bus, the local bus having a transfer parallelism lower than the address parallelism and the data parallelism, wherein the command includes a selection field for selecting random multiple sectors of at least one block, and a control unit for executing an operation corresponding to the command in respect of each selected sector;

a protection register associated with each sector, the operation being a write operation of the protection register of each selected sector; and a switching circuit operable to switch the integrated memory device between a first operative mode and a second operative mode, and means for switching the integrated memory device between a first configuration and a second configuration, in the first operative mode the selection field selecting each sector of a block individually and the control means writing the protection register of each selected sector, in the second operative mode with the first configuration the selection field selecting a single block and the control means writing the protection registers of all the sectors of the selected block, and in the second operative mode with the second configuration the selection field selecting a single sector and the control means writing the protection register of the selected sector.

9. A method of operating an integrated memory device including a flash memory having an address parallelism and a data parallelism, the flash memory being partitioned into a plurality of blocks each one including a plurality of sectors being erasable individually, wherein the method includes the steps of:

receiving a command from an external bus having a transfer parallelism lower than the address parallelism and the data parallelism, the command including a selection field for selecting random multiple sectors of at least one block, executing an operation corresponding to the command in respect of each selected sector;

switching the integrated memory device between a first operative mode and a second operative mode, and switching the integrated memory device between a first configuration and a second configuration, in the first operative mode the selection field selecting each sector of a block individually and the step of executing the operation including writing the protection register of each selected sector, in the second operative mode with the first configuration the selection field selecting a single block and the step of executing the operation including writing the protection registers of all the sectors of the selected block, and in the second operative mode with the second configuration the selection field selecting a single sector and the step of executing the operation including writing the protection register of the selected sector.

10. The method according to claim 9, wherein the at least one selected block consists of a single block, the selection field including an address of the selected block and a selection mask for the sectors of the selected block.

11. The method according to claim 10, wherein the operation is an erase operation of each selected sector.

12. The method according to claim 10, wherein a protection register is associated with each sector, the operation being a write operation of the protection register of each selected sector.

13. A method of operating an integrated memory device including a flash memory having an address parallelism and a data parallelism, the flash memory being partitioned into a plurality of blocks each one including a plurality of sectors being erasable individually, wherein the method includes the steps of:

receiving a command from an external bus having a transfer parallelism lower than the address parallelism and the data parallelism, the command including a selection field for selecting random sectors of at least one block individually, wherein the at least one selected block consists of a single block, the selection field including an address of the selected block and a selection mask for the sectors of the selected block;

executing an erase operation corresponding to the command in respect of each selected sector;

wherein the command includes a main code identifying the erase operation and a secondary code having a first value, a second value or a third value, when the secondary code has the first value the selection field selecting each sector of a block individually and the step of executing the operation including erasing each selected sector, when the secondary code has the second value the selection field selecting a single block and the step of executing the operation including erasing all the sectors of the selected block, and when the secondary code has the third value the selection field selecting a single sector and the step of executing the operation including erasing the selected sector; and wherein an erase command requires a first and a second communication cycles with the external bus each one involving the transmission of a command field, an address field and a data field, in the first communication cycle the command field including the main code and the data field including the secondary code, and in the second communication cycle when the secondary code has the first value the address field including the address of the selected block and the data field including the selection mask, when the secondary field has the second value the address field including the address of the selected block, and when the secondary field has the third value the address field including the address of the selected sector.

14. The method according to claim 13, further including the steps of:

generating a further selection mask of all the sectors of the selected block in response to the secondary code having the second value or a still further selection mask of the selected sector in response to the secondary code having the third value, setting an erase mask according to the selection mask in response to the secondary code having the first value, to the further selection mask in response to the secondary code having the second value, and to the still further selection mask in response to the secondary code having the third value, and applying an erase pulse to each sector of the selected block according to the erase mask.

15. A method of operating an integrated memory device including a flash memory having an address parallelism and a data parallelism, the flash memory being partitioned into a plurality of blocks each one including a plurality of sectors being erasable individually, wherein the method includes the steps of:

receiving a command from an external bus having a transfer parallelism lower than the address parallelism and the data parallelism, the command including a selection field for selecting random sectors of at least one block individually, wherein the at least one selected block consists of a single block, the selection field including an address of the selected block and a selection mask for the sectors of the selected block;

executing an operation corresponding to the command in respect of each selected sector, wherein the operation is a write operation of a protection register associated with each selected sector;

switching the integrated memory device between a first operative mode and a second operative mode, and switching the integrated memory device between a first configuration and a second configuration, in the first operative mode the selection field selecting each sector of a block individually and the step of executing the operation including writing the protection register of each selected sector, in the second operative mode with the first configuration the selection field selecting a single block and the step of executing the operation including writing the protection registers of all the sectors of the selected block, and in the second operative mode with the second configuration the selection field selecting a single sector and the step of executing the operation including writing the protection register of the selected sector.

16. The method according to claim 15, wherein the write command requires at least one communication cycle with the external bus involving the transmission of a command field, an address field and a data field, wherein in the first operative mode the write command requires a first and a second communication cycles, in the first communication cycle the command field including a write code identifying the write operation and the data field including a value to be written on each selected sector, and in the second communication cycle the address field including the address of the selected block and the data field including the selection mask, and wherein in the second operative mode the write command requires a single communication cycle, the command field including the write code, the address field including the address of the selected block and further including the address of the selected sector with the second configuration, and the data field including the value to be written on each selected sector.

17. The method according to claim 16, further including the steps of:

in response to the write code, generating a further selection mask of all the sectors of the selected block in the second operative mode with the first configuration or a still further selection mask of the selected sector in the second operative mode with the second configuration, setting a write mask according to the selection mask in the first operative mode, to the further selection mask in the second operative mode with the first configuration, and to the still further selection mask in the second operative mode with the second configuration, and enabling the update of each protection register according to a write mask.

18. A memory device including a plurality of memory blocks, each block including a plurality of sectors that are individually accessible and the memory device being adapted to receive a command that includes selection data for the selection of random multiple sectors of at least one memory block, and the memory device operable in response to the command to perform an operation on the selected multiple sectors corresponding to the selection data, and wherein the memory device is further operable in a first mode responsive to the selection data to individually select sectors of a memory block and is operable in a second mode responsive to the selection data to select either all the sectors of a single block or to select a single sector within a given block.

19. The memory device of claim 18 wherein the operation performed in response to the command comprises an erase operation.

20. The memory device of claim 18 wherein the selection data comprises a selection mask for the sectors of each memory block, the selection mask identifying specific sectors to be erased within each block.

21. The memory device of claim 18 wherein the selection data portion of the command is received during a single communications cycle.

22. A method of operating a memory device including a bus and including a plurality of memory blocks, each memory block including a plurality of sectors being individually accessible, the method comprising:

receiving a command on the bus, the command including selection data associated with random multiple sectors of at least one memory block; and responsive to the selection data, operating in a first mode to individually select sectors of a memory block, and operating in a second mode to select either all the sectors of a single memory block or to select a single sector within a given memory block.

23. The method of claim 22 wherein accessing sectors in each memory block comprises erasing the sectors in each memory block that correspond to the associated selection data.

24. The method of claim 22 wherein the selection data includes an address for each memory block and for each such memory block includes a selection mask for the sectors of the block.

25. The method of claim 22 wherein receiving a command on the bus occurs during first and a second communication cycles.

* * * * *